United States Patent
Terrovitis

(10) Patent No.: US 8,723,568 B1
(45) Date of Patent: May 13, 2014

(54) LOCAL OSCILLATOR SIGNAL GENERATION USING DELAY LOCKED LOOPS

(71) Applicant: QUALCOMM Incorporated, San Diego, CA (US)

(72) Inventor: Emmanouil Terrovitis, Foster City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/137,504

(22) Filed: Dec. 20, 2013

(51) Int. Cl.
  *H03L 7/18* (2006.01)
(52) U.S. Cl.
  USPC .......................................... 327/157; 327/148
(58) Field of Classification Search
  USPC ................................................ 327/148, 157
  See application file for complete search history.

(56) References Cited

U.S. PATENT DOCUMENTS

| | | | |
|---|---|---|---|
| 6,919,744 B2 | 7/2005 | Paist et al. | |
| 7,356,111 B1 | 4/2008 | Dean | |
| 8,049,543 B2 | 11/2011 | Kang et al. | |
| 8,059,777 B2 | 11/2011 | Wilhite et al. | |
| 8,487,678 B2 | 7/2013 | Yang | |
| 8,536,915 B1 * | 9/2013 | Terrovitis | 327/158 |
| 2005/0116782 A1 * | 6/2005 | Smith | 331/17 |
| 2011/0025382 A1 * | 2/2011 | van Der Wel et al. | 327/117 |
| 2012/0105119 A1 * | 5/2012 | Kim et al. | 327/158 |
| 2012/0139593 A1 * | 6/2012 | Saito | 327/156 |
| 2012/0194231 A1 * | 8/2012 | Yun et al. | 327/147 |
| 2013/0002320 A1 * | 1/2013 | Lin et al. | 327/158 |
| 2013/0271193 A1 * | 10/2013 | Keith | 327/158 |
| 2013/0321048 A1 * | 12/2013 | He | 327/156 |
| 2014/0002152 A1 * | 1/2014 | Terrovitis | 327/157 |
| 2014/0003570 A1 * | 1/2014 | Terrovitis | 377/48 |
| 2014/0015574 A1 * | 1/2014 | Lee | 327/156 |

* cited by examiner

*Primary Examiner* — Adam Houston
(74) *Attorney, Agent, or Firm* — Mahamedi Paradice Kreisman LLP

(57) ABSTRACT

A clock generation circuit is disclosed that may generate a plurality of phase-delayed signals in a manner that may be relatively immune to VCO pulling. The clock generation circuit may include a circuit to generate an oscillating signal, a frequency divider to generate an RF signal having a frequency that is equal to $1/(n+0.5)$ times the frequency of the oscillating signal, wherein n is an integer value greater than or equal to one and n+0.5 is a non-integer value, and a DLL circuit to generate a plurality of local oscillator signals, wherein the local oscillator signals are phase-delayed with respect to each other.

29 Claims, 8 Drawing Sheets

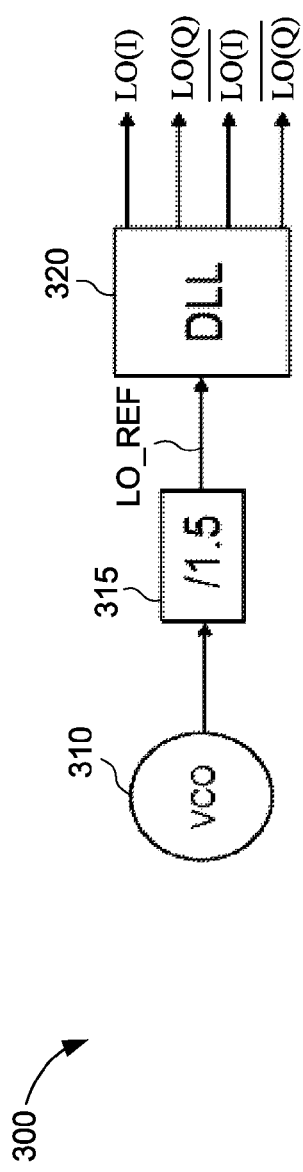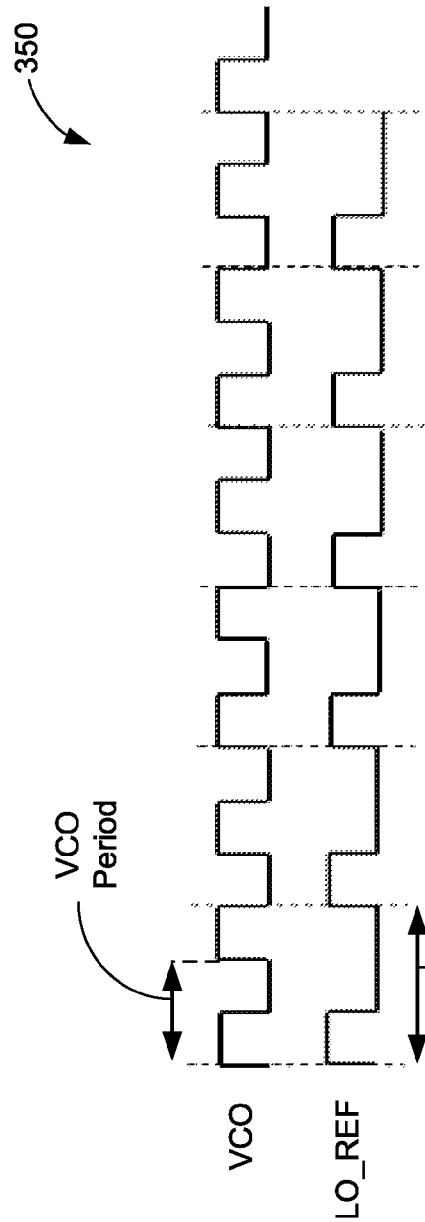
FIG. 3A
FIG. 3B

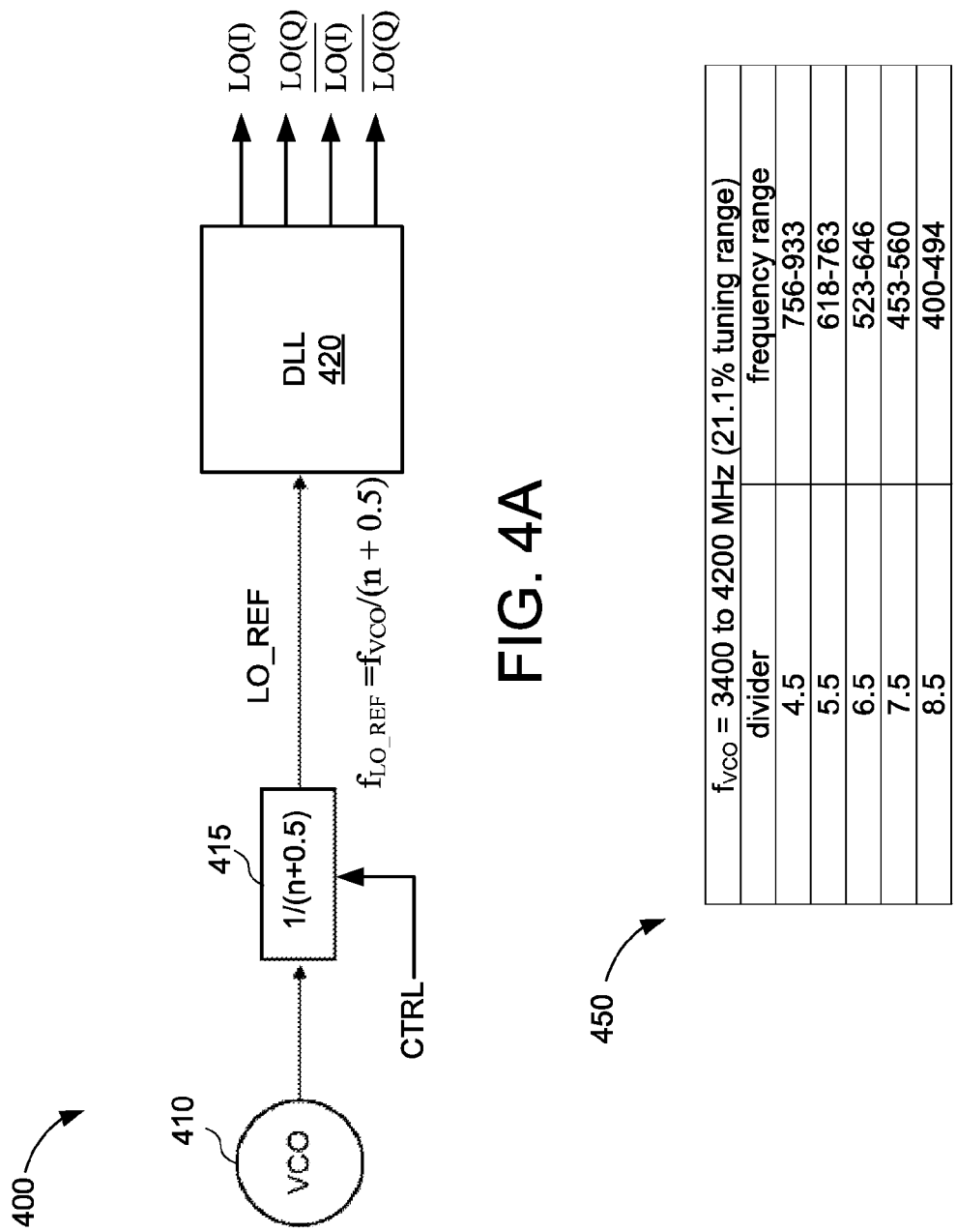

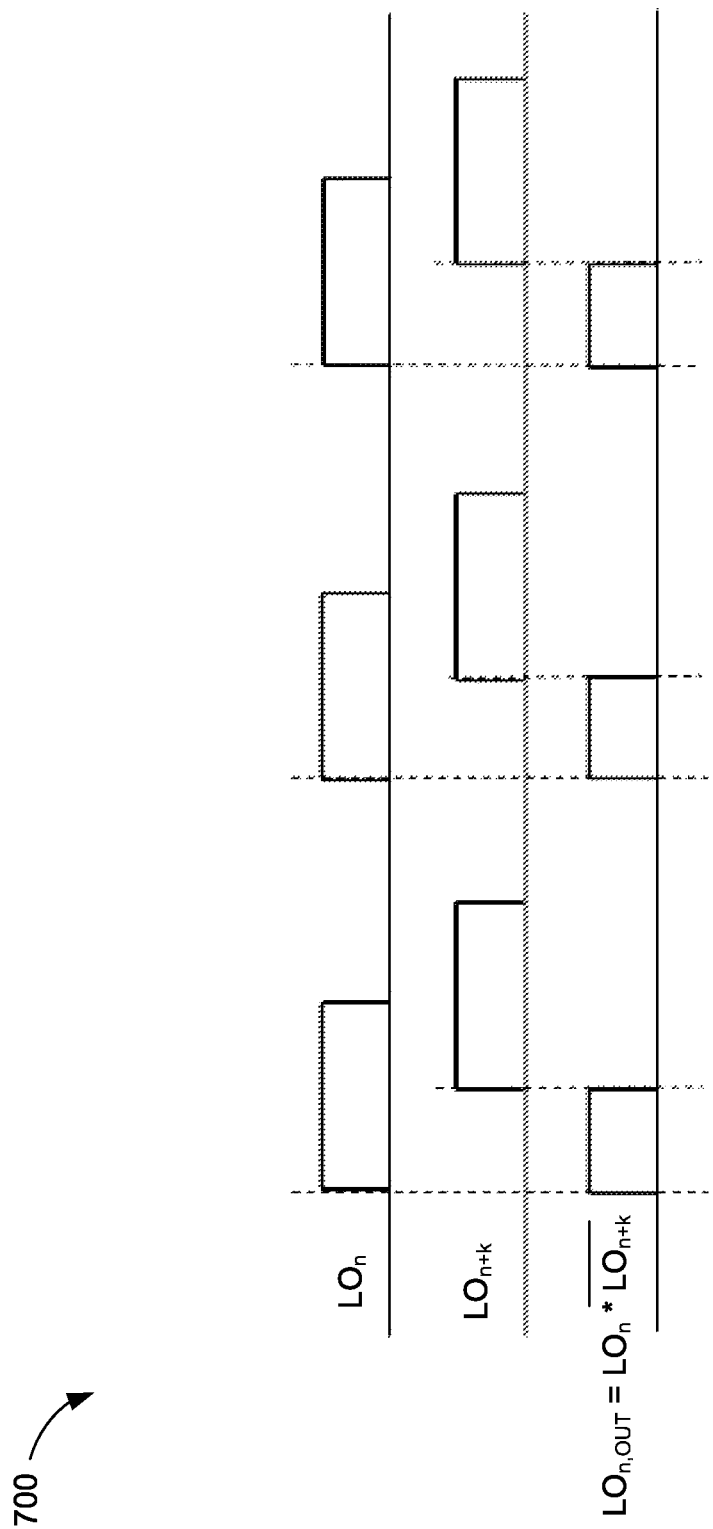

LOCAL OSCILLATOR SIGNAL GENERATION USING DELAY LOCKED LOOPS

TECHNICAL FIELD

The present embodiments relate generally to oscillator signals, and specifically to generating local oscillator signals using delay locked loop circuits.

BACKGROUND OF RELATED ART

Frequency planning for radios may refer to the selection and use of various signal frequencies including, for example, the output frequency of a Voltage Controlled Oscillator (VCO), the frequency and/or generation scheme of local oscillator (LO) signals, the values of one or more intermediate frequencies (IF) in the radio's signal paths, and so on. Direct-sampling receivers sample a received signal without down-converting the received signal. In contrast, direct-conversion receivers use LO signals to down-convert the received signal (e.g., from radio-frequency (RF) to baseband frequency) to generate in-phase (I) and quadrature (Q) signals, and then sample the I and Q signals at the baseband frequency. Down-converting the received signal allows for a lower-frequency sampling clock (as compared to direct-sampling receivers), but introduces signal impairments resulting from local oscillator noise and/or I/O mismatch.

The VCO may be used to generate the LO signals for down-conversion in the receiver and for up-conversion in an associated transmitter. When the VCO frequency is equal to or is an integer multiple of the RF frequency, direct-conversion transceivers may be prone to VCO pulling. Thus, it would be desirable to generate LO signals in a manner that minimizes VCO pulling. In addition, it may also be desirable to generate multiple phases of the LO signals in a manner that minimizes VCO pulling.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A clock generation circuit and method of operation are disclosed that may generate a plurality of phase-delayed signals in a manner that is relatively immune to VCO pulling. For some embodiments, VCO pulling may be minimized by generating the plurality of phase-delayed local oscillator signals using a delay-locked loop (DLL) circuit responsive to a local oscillator reference signal having a frequency that is a non-integer fraction of an oscillating signal. For at least one embodiment, the clock generation circuit includes a voltage-controlled oscillator (VCO), a frequency divider, and a DLL circuit. The VCO may generate the oscillating signal having a frequency. The frequency divider, which is coupled to the VCO, may generate the local oscillator reference signal having a frequency that is equal to $1/(n+0.5)$ times the frequency of the oscillating signal, wherein n is an integer value greater than or equal to one and $(n+0.5)$ is a non-integer value. The DLL circuit, which includes an input to receive the local oscillator reference signal, includes a plurality of outputs to provide the plurality of local oscillator signal phases, wherein the local oscillator signal phases are phase-delayed with respect to each other. For an exemplary embodiment, the DLL circuit may generate four local oscillator signal phases that are each phase-delayed, with respect to a previous local oscillator signal phase, by a quarter of the period of the oscillating signal.

For at least one embodiment, the frequency divider may include a control terminal to receive a control signal indicative of the value of n. In this manner, the value of n, and thus the frequency relationship between the oscillating signal and the local oscillator reference signal (and thus the frequency relationship between the oscillating signal and the local oscillator signal phases) may be dynamically modified.

For some embodiments, the DLL circuit may include a phase-and-frequency detector, a charge pump, and a delay line. The phase-and-frequency detector may include inputs to receive a reference signal and a feedback signal, and may generate control signals indicative of a phase difference between the reference signal and the feedback signal. The charge pump, coupled to the phase-and-frequency detector, may generate a control voltage in response to the control signals. The delay line, which includes a first input to receive the local oscillator reference signal (or alternatively the oscillating signal) and a second input to receive the control voltage, may generate the reference signal and the feedback signal of the DLL circuit, and a plurality of DLL output phases from which the plurality of local oscillator signal phases can be derived. For at least one embodiment, the delay line may include first and second signal paths, separate from one another, to generate the reference signal and the feedback signal of the DLL circuit, respectively. Further, the delay line may include a plurality of series-connected delay elements that provide the plurality of local oscillator signal phases.

BRIEF DESCRIPTION OF THE DRAWINGS

The present embodiments are illustrated by way of example and are not intended to be limited by the figures of the accompanying drawings, where:

FIG. 3A shows a block diagram of a clock generation circuit in accordance with other embodiments.

FIG. 3B shows an exemplary timing diagram of the relative phases of the VCO signal and the local oscillator reference signal associated with the clock generation circuit of FIG. 3A.

FIG. 4A shows a block diagram of a clock generation circuit in accordance with still other embodiments.

FIG. 4B is a table illustrating exemplary frequency ranges associated with the clock generation circuit of FIG. 4A.

FIG. 7 is a timing diagram illustrating an exemplary generation of the local oscillator signal phases with desirable duty cycle in accordance with some embodiments.

DETAILED DESCRIPTION

The present embodiments are discussed below in the context of processing signals having exemplary frequency values for simplicity only. It is to be understood that the present embodiments are equally applicable for processing signals of various suitable frequencies and/or frequency ranges, and for processing signals using any suitable encoding and/or modulation technique.

In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scopes all embodiments defined by the appended claims.

Figure 1:
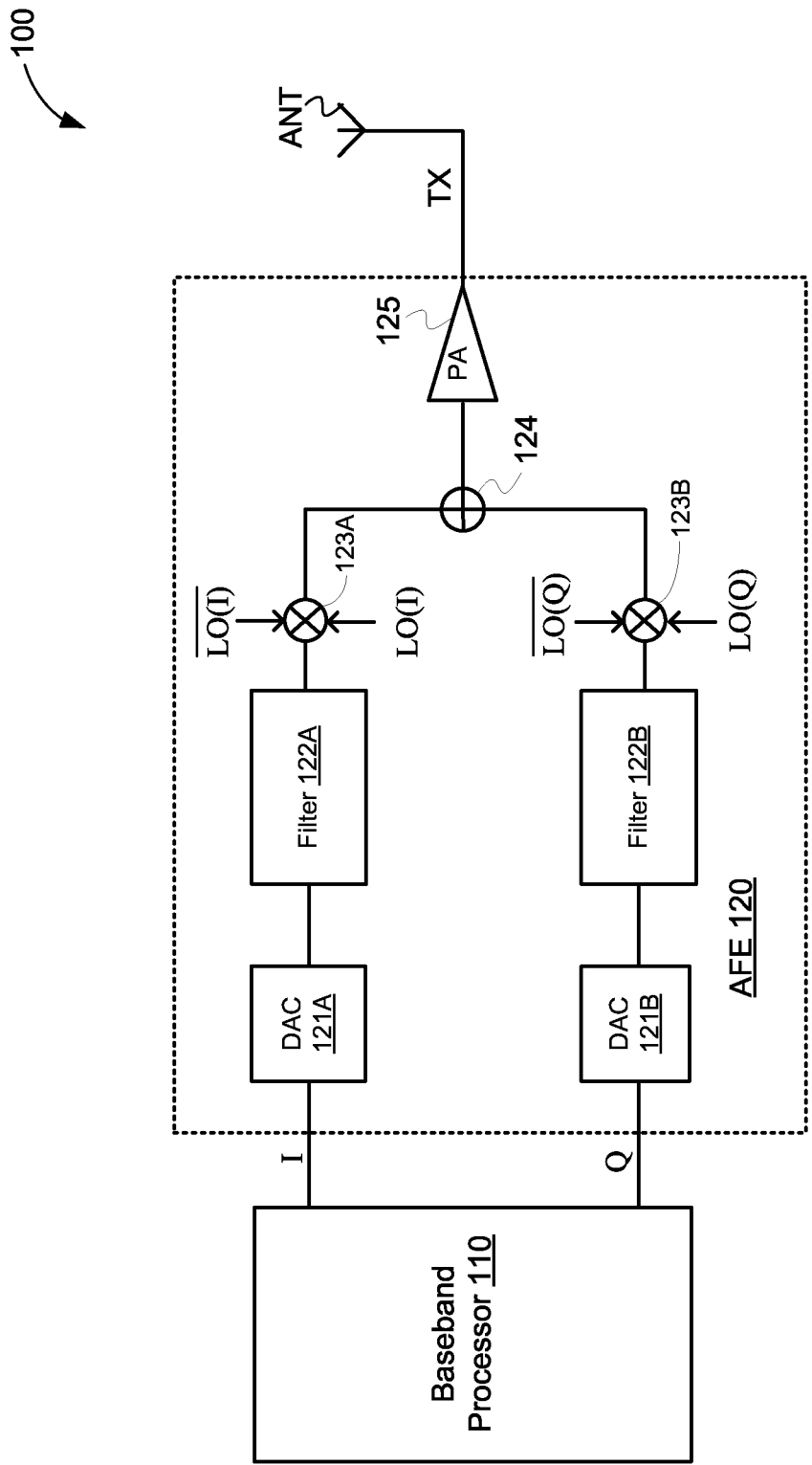
FIG. 1 is a block diagram of a direct conversion transmitter within which the present embodiments may be implemented.

FIG. 1 is a block diagram of a conventional direct-conversion transmitter 100. Transmitter 100 includes an antenna ANT, a baseband processor 110, and an analog front end (AFE) 120. The AFE 120 includes a digital-to-analog converter (DAC) 121A for the I signal path, a filter 122A for the I signal path, a local oscillator (LO) mixer 123A for the I signal path, a DAC 121B for the Q signal path, a filter 122B for the Q signal path, an LO mixer 123B for the Q signal path, a combiner 124, and a linear power amplifier (PA) 125. The first mixer 123A up-converts the I signal from baseband directly to the carrier frequency by mixing the I signal with in-phase local oscillator signals LO(I) and $\overline{LO(I)}$, and the second mixer 123B up-converts the Q signal from baseband directly to the carrier frequency by mixing the Q signal with quadrature local oscillator signals LO(Q) and $\overline{LO(Q)}$, where the frequency of the local oscillator signals is the carrier frequency. The two in-phase local oscillator signals, LO(I) and $\overline{LO(I)}$, may be phase delayed by 180 degrees with respect to each other and provide differential LO signaling for the I path; similarly, the two quadrature local oscillator signals, LO(Q) and $\overline{LO(Q)}$, may be phase delayed by 180 degrees with respect to each other and provide differential LO signaling for the Q path. For some embodiments, the mixers 123A-123B may up-covert differential I and Q signals, respectively. The combiner 124 combines the up-converted I and Q signals, and the PA 125 amplifies the combined I/O signal for transmission as TX via the antenna ANT.

Figure 2A:
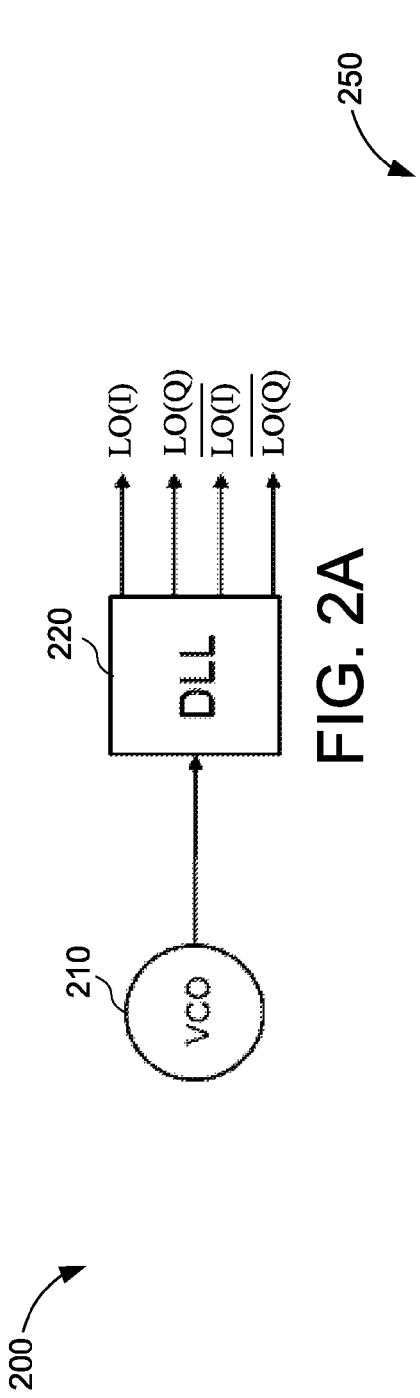
FIG. 2A shows a block diagram of a clock generation circuit in accordance with some embodiments.
Figure 2B:
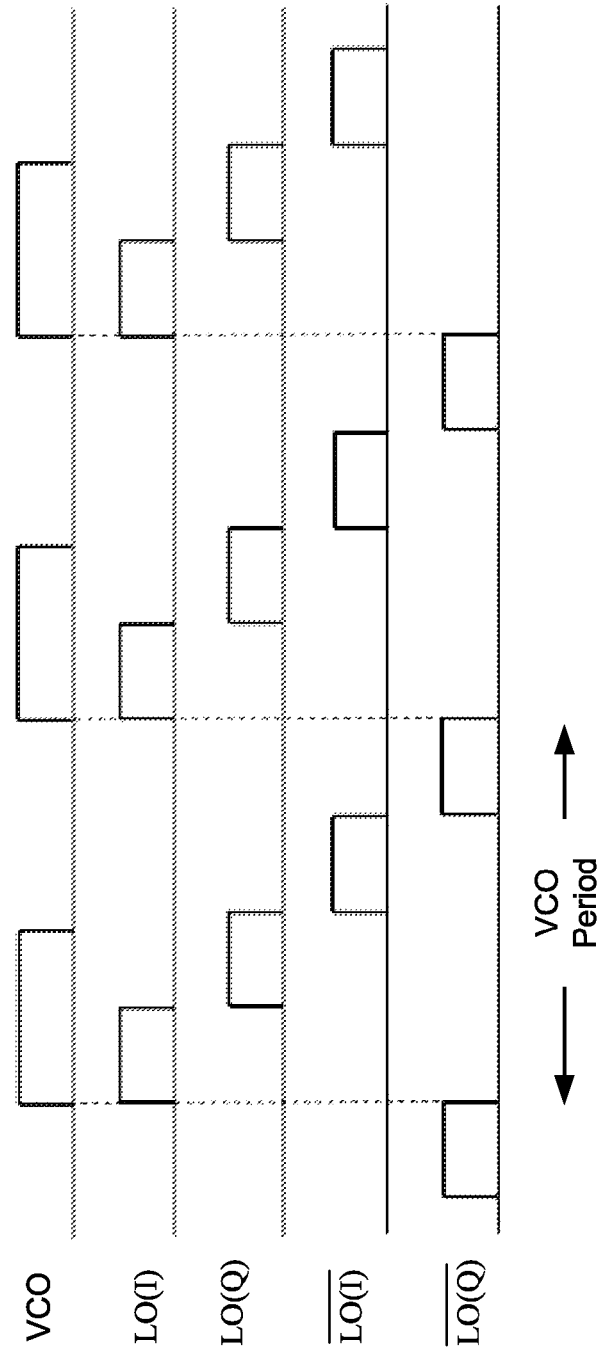
FIG. 2B shows an exemplary timing diagram of the four local oscillator signal phases generated by the clock generation circuit of FIG. 2A.

FIG. 2A shows a block diagram of a clock generation circuit 200 that generates four local oscillator signal phases LO(I), LO(Q), $\overline{LO(I)}$, and $\overline{LO(Q)}$, which in turn may be used by the up-conversion mixers of transmitter 100 of FIG. 1 to up-convert the I and Q signals from baseband to RF, or similarly by down-conversion mixers of a receiver (not shown for simplicity) to down-convert the RF signal to baseband I and Q signals. Clock generation circuit 200 includes a VCO 210 coupled to a delay-locked loop (DLL) circuit 220. The VCO 210, which may be any suitable VCO or other suitable oscillator circuit, generates an oscillating signal (VCO) of frequency $f_{VCO}$ equal to the RF frequency (i.e., $f_{VCO}=f_{RF}$). The DLL circuit 220 includes a delay line and plurality of delay taps (not shown in FIG. 2A for simplicity) that generate the local oscillator signal phases LO(I), LO(Q), $\overline{LO(I)}$, and $\overline{LO(Q)}$ in response to the oscillating signal. As depicted in the timing diagram 250 of FIG. 2B, the four local oscillator signal phases, LO(I), LO(Q), $\overline{LO(I)}$, and $\overline{LO(Q)}$, are staggered relative to each other, for example, such that the LO(I) signal phase is delayed by one-half the VCO period to generate the $\overline{LO(I)}$ signal phase, and the LO(Q) signal phase is delayed by one-half the VCO period to generate the $\overline{LO(Q)}$ signal phase. Note that the LO(I) and LO(Q) signal phases are phase-delayed with respect to each other by one-quarter of the VCO period (e.g., 90 degrees), and that the $\overline{LO(I)}$ and $\overline{LO(Q)}$ signal phases are phase-delayed with respect to each other by one-quarter the VCO period (e.g., 90 degrees). Although sensitive to VCO pulling (e.g., because $f_{VCO}$ is equal to the RF frequency), the clock generation circuit 200 may be applicable for use in a receiver, or transmitter 100 when transmitter 100 is operating at relatively low transmit output power levels. The embodiment of FIG. 2A may be generalized by allowing the VCO 210 to oscillate at n times the RF frequency, wherein n is an integer, by providing an integer frequency divider (not shown for simplicity) between the VCO 210 and the DLL circuit 220. The integer frequency divider may divide the VCO frequency $f_{VCO}$ by the integer n, and may provide the frequency divided signal (e.g., having a frequency equal to the RF frequency) as a reference signal to the DLL circuit 220.

FIG. 3A shows a clock generation circuit 300 that, in accordance with the present embodiments, may generate the local oscillator signal phases LO(I), LO(Q), $\overline{LO(I)}$, and $\overline{LO(Q)}$ in a manner that reduces VCO pulling when used in a transmitter (e.g., as compared to the clock generation circuit 200 of FIG. 2A). Clock generation circuit 300 includes a VCO 310, a divide-by-1.5 circuit 315, and a DLL circuit 320. The VCO 310 is coupled to divide-by-1.5 circuit 315, which is coupled to DLL circuit 320. The VCO 310, which may be any suitable VCO or other suitable oscillator circuit, generates an oscillating signal (VCO) of frequency $f_{VCO}$ equal to 1.5 times the RF frequency (i.e., $f_{VCO}=1.5*f_{RF}$), The divide-by-1.5 circuit 315 divides the VCO signal by a factor N=1.5 to generate a local oscillator reference signal (LO_REF) of frequency $f_{LO\_REF}$. Thus, the frequency $f_{VCO}$ of the oscillating signal is 1.5 times the frequency $f_{LO\_REF}$ of the LO reference signal LO_REF, and the local oscillator reference signal frequency $f_{LO\_REF}$ is equal to the RF frequency $f_{RF}$. The DLL circuit 320 includes a delay line and plurality of delay taps (not shown in FIG. 3A for simplicity) that generate the local oscillator signal phases LO(I), LO(Q), $\overline{LO(I)}$, and $\overline{LO(Q)}$ in response to the local oscillator reference signal. The four local oscillator signal phases, LO(I), LO(Q), $\overline{LO(I)}$, and $\overline{LO(Q)}$, are staggered relative to each other, for example, such that the LO(I) signal phase is delayed by one-half the VCO period to generate the $\overline{LO(I)}$ signal phase, and the LO(Q) signal phase is delayed by one-half the VCO period to generate the $\overline{LO(Q)}$ signal phase (e.g., as depicted in the timing diagram 250 of FIG. 2B).

FIG. 3B is a timing diagram 350 depicting the waveforms of the VCO signal of frequency $f_{VCO}$ and the local oscillator reference signal LO_REF of frequency $f_{LO\_REF}$. As mentioned above, for the exemplary embodiment of FIG. 3A, the frequency $f_{VCO}$ of the VCO signal is equal to 1.5 times the frequency $f_{LO\_REF}$ of the LO reference signal, and thus the period of the LO reference signal is equal to 1.5 times the period of the VCO signal. Because the frequency $f_{VCO}$ of the VCO signal is a non-integer multiple (i.e., N=1.5) of the frequency $f_{LO\_REF}$ of the LO reference signal, the clock generation circuit 300 is less susceptible to VCO pulling (e.g., as compared to clock generation circuit 200 of FIG. 2A). It is noted that for the divide-by-1.5 circuit 315 to accurately divide the VCO signal by a factor N=1.5, the divide-by-1.5 circuit 315 is to be triggered by alternating rising and falling edges of the VCO signal (e.g., as depicted in FIG. 3B). However, triggering the divide-by-1.5 circuit 315 with alternating rising and falling edges of the VCO signal may undesirably create spurs at frequencies equal to $0.5*f_{RF}$, $1.5*f_{RF}$, $2.5*f_{RF}$, and so on, if the duty cycle of the VCO signal is not 50%.

The embodiment of FIG. 3A may be generalized by replacing the divide-by-1.5 circuit 315 with a divide-by-(n+0.5) circuit, for example, as shown in FIG. 4A. Specifically, FIG. 4A shows a clock generation circuit 400 including a VCO 410, a divide-by-(n+0.5) circuit 415, and a DLL circuit 420. The VCO 410 is coupled to divide-by-(n+0.5) circuit 415, which is coupled to DLL circuit 420. The VCO 410, which may be any suitable VCO or other suitable circuit, generates an oscillating signal (VCO) having a frequency $f_{VCO}$ that is equal to n+0.5 times the frequency $f_{LO\_REF}$ of the local oscillator reference signal LO_REF (i.e., $f_{VCO}=(n+0.5)*f_{LO\_REF}$). The divide-by-(n+0.5) circuit 415 divides the VCO signal by a factor equal to n+0.5 to generate the local oscillator reference signal LO_REF. The DLL circuit 420 includes a delay line and plurality of delay taps (not shown in FIG. 4A for simplicity) that generate the local oscillator signal phases LO(I), LO(Q), $\overline{LO(I)}$, and $\overline{LO(Q)}$ in response to the local oscillator reference signal LO_REF. The four local oscillator signal phases, LO(I), LO(Q), $\overline{LO(I)}$, and $\overline{LO(Q)}$, are staggered relative to each other, for example, such that the LO(I) signal phase is delayed by one-half the LO period to generate the $\overline{LO(I)}$ signal phase, and the LO(Q) signal phase is delayed by one-half the LO period to generate the $\overline{LO(Q)}$ signal phase (e.g., as depicted in the timing diagram 250 of FIG. 2B).

For the exemplary embodiment of FIG. 4A, the value of n is an integer that may be programmable and provided as a control signal (CTRL) to the divide-by-(n+0.5) circuit 415. Because of the non-integer relationship between the frequency $f_{VCO}$ of the VCO signal and the frequency $f_{LO\_REF}$ of the local oscillator reference signal LO_REF, the clock generation circuit 400 is less susceptible to VCO pulling (e.g., as compared to clock generation circuit 20 of FIG. 2A). Because the value of n is programmable (and may be dynamically adjusted, for example, by modifying the value of the control signal provided to the divide-by-(n+0.5) circuit 415), the clock generation circuit 400 may achieve a relatively large RF frequency range with a relatively small VCO tuning range (e.g., as compared to the clock generation circuit 200 of FIG. 2A). For example, FIG. 4B shows a table 450 depicting exemplary RF frequency ranges of clock generation circuit 400 associated with a VCO tuning range from 3400 MHz to 4200 MHz. As depicted in FIG. 4B, the clock generation circuit 400 may cover an RF frequency range of 400 MHz to 933 MHz (~80%) with a 21.1% VCO tuning range.

Figure 5:
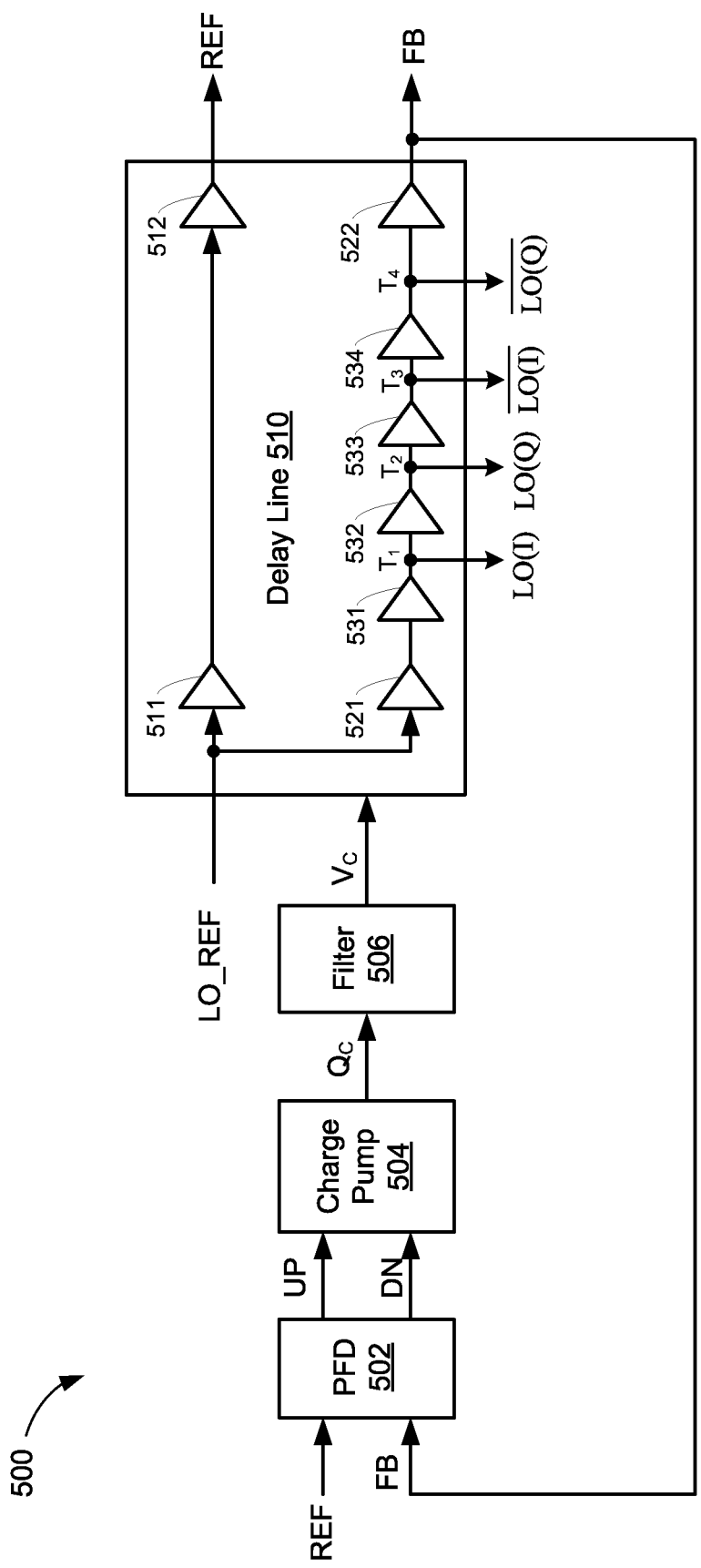
FIG. 5 shows a block diagram of a delay-locked loop (DLL) circuit in accordance with some embodiments.

FIG. 5 shows a DLL circuit 500 that may be one embodiment of the DLL circuits 220, 320, and/or 420 described above. The DLL circuit 500 includes a phase-and-frequency detector (PFD) 502, a charge pump 504, a loop filter 506, and a voltage-controlled delay line 510. The PFD 502 receives a reference signal (REF) and a feedback signal (FB) at its inputs. The PFD 502 compares the phase of the FB signal with the phase of the REF signal to generate up (UP) and down (DN) control signals. Charge pump 504 uses the UP and DN control signals to generate a charge ($Q_C$) that is proportional to the phase difference between the two signals FB and REF. The charge generated by the charge pump 504 is filtered (e.g., integrated) by filter 506 and provided as a control voltage $V_C$ to a control terminal of the delay line 510.

For some embodiments, the DLL circuit of FIG. 5 may perform one comparison of the phases of the reference (REF) signal and the feedback (FB) signal for every period of the local oscillator reference signal LO_REF. If the frequency $f_{LO\_REF}$ of the local oscillator reference signal is relatively high (e.g., greater than some specified threshold frequency), it may not be possible for the phase-and-frequency detector 502 and the charge pump 504 to operate at this relatively high frequency. In this case, the phase-and-frequency detector 502 may be configured to compare the reference signal and the feedback signal only once every M periods of the local oscillator reference signal, wherein M is an integer, thus reducing the frequency of operation of the phase-and-frequency detector 502 and the charge pump 504 by a factor of M.

The delay line 510 includes an input terminal to receive the local oscillator reference signal LO_REF, a first output terminal to provide the REF signal, and a second output terminal to provide the FB signal. In addition, the delay line 510 includes a first set of buffer circuits 511-512, a second set of buffer circuits 521-522, and four series-connected delay elements 531-534. The first buffer circuits 511-512, which are coupled between the input terminal and the first output terminal of the delay line 510, form a first signal path that generates the REF signal based on the local oscillator reference signal LO_REF. For some embodiments, the first buffer circuits 511-512 may buffer (e.g., increase the drive strength of) the LO reference signal LO_REF to generate the REF signal.

The second buffer circuits 521-522 and the delay elements 531-534, which are coupled between the input terminal and the second output terminal of the delay line 510, form a second signal path that generates the FB signal based on local oscillator reference signal LO_REF. The buffer circuit 521 is coupled between the input terminal and the series-connected delay elements 531-534, and the buffer circuit 522 is coupled between the series-connected delay elements 531-534 and the second output terminal. The buffer circuit 521 may buffer (e.g., increase the drive strength of) the LO reference signal LO_REF prior to processing by the delay elements 531-534, and the buffer circuit 522 may buffer (e.g., increase the drive strength of) the FB signal. For some embodiments, buffer circuit 521 may match (or otherwise offset) any propagation delays associated with buffer circuit 511, and buffer circuit 522 may match (or otherwise offset) any propagation delays associated with buffer circuit 512. For other embodiments, buffer circuits 511-512 and/or buffer circuits 521-522 may be omitted.

The series-connected delay elements 531-534 provide four corresponding delay taps T1-T4 at which the four phases of the local oscillator signal phases LO(I), LO(Q), $\overline{LO(I)}$, and $\overline{LO(Q)}$ may be generated. As mentioned above, the local oscillator signal phases LO(I), LO(Q), $\overline{LO(I)}$, and $\overline{LO(Q)}$ may be provided to the up-conversion mixers 123A and 123B of the transmitter 100 of FIG. 1 (or similarly, the down-conversion mixers of a receiver). More specifically, the delay elements 531-534 may selectively delay the local oscillator reference signal LO_REF in response to $V_C$ to generate the local oscillator signal phases LO(I), LO(Q), $\overline{LO(I)}$, and $\overline{LO(Q)}$, respectively. Further, the FB signal, as output from the delay line 510, may be synchronized (e.g., delay-locked) with the REF signal by adjusting the delays provided by the delay elements 531-534 (e.g., in response to the control voltage $V_c$) until the period of the FB signal equals the period of the local oscillator reference signal $f_{LO\_REF}$.

For other embodiments, other numbers of delay elements may be provided in the delay line 510, for example, to provide other numbers of phase-delayed local oscillator signals. Thus, although the delay line 510 is shown in FIG. 5 as including 4 delay elements 531-534, the delay line 510 may include a greater number or a fewer number of the delay elements. Similarly, other numbers of buffer circuits 511-512 may be provided in the first signal line, and other numbers of buffer circuits 521-522 may be provided in the second signal line.

Figure 6:
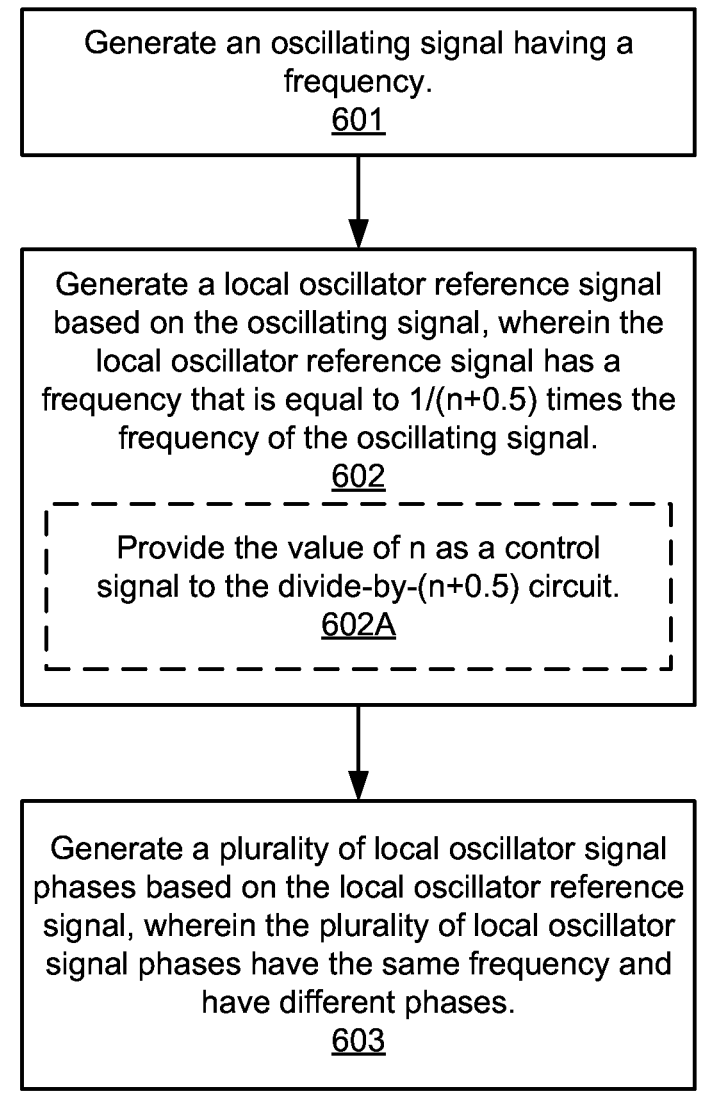
FIG. 6 is an illustrative flow chart depicting an exemplary clock generation operation in accordance with some embodiments.

An exemplary operation of clock generation circuit 400 is described below with respect to the illustrative flow chart 600 of FIG. 6. First, the VCO 410 generates an oscillating signal of frequency $f_{VCO}$ (601). Then, the divide-by-(n+0.5) circuit 415 generates a local oscillator reference signal LO_REF with frequency $f_{LO\_REF}$ based on the oscillating signal, wherein the local oscillator reference signal frequency $f_{LO\_REF}$ is equal to 1/(n+0.5) times the frequency $f_{VCO}$ of the oscillating signal (wherein n is an integer value greater than or equal to one and n+0.5 is a non-integer value) (602). For some embodiments, a control signal (CTRL) indicative of the value of n may be provided to the divide-by-(n+0.5) circuit 415 (602A). In this manner, the value of n, and thus the relationship between the frequency $f_{VCO}$ of the oscillating signal and the frequency $f_{LO\_REF}$ of the local oscillator reference signal may be dynamically modified. For other embodiments, the divide-by-(n+0.5) circuit 415 may be replaced by a divide-by-n circuit, for example, so that the local oscillator reference signal frequency $f_{LO\_REF}$ is equal to 1/n times the frequency $f_{VCO}$ of the oscillating signal.

Next, the DLL circuit 420 generates a plurality of local oscillator signal phases (e.g., LO(I), LO(Q), $\overline{LO(I)}$, and $\overline{LO(Q)}$) based on the local oscillator reference signal LO_REF, wherein the plurality of local oscillator signal phases have the same frequency as each other and have different phases with respect to one another.

It will be appreciated that the embodiments described herein may be used to produce a plurality of phases of a local oscillator signal in a manner that may not be susceptible to VCO pulling. Specifically, the generation of four phases of a local oscillator signal may be used by transmitters (and receivers) for up-converting I and Q signals (and down-converting RF signals).

It is noted that mismatch between the delay elements 531-534 of the delay line 510, as well as static phase errors introduced by imperfections in the charge pump 504 and/or mismatches between the reference and the feedback paths of the DLL circuit 500, may distort the timing of the generated LO signal phases. Mismatches may be reduced by using larger delay elements, which may dissipate more power and consume more circuit area. However, because present transceivers typically compensate for mismatch between the LO signal phases (e.g., by manipulating the transmitted or received signal in the digital domain), it may not be necessary to separately compensate for mismatch between the delay elements 531-534 of the delay line 510.

It is also noted that noise in the DLL circuit 500 may cause noise in the signal path. The DLL noise may be reduced at the expense of circuit area and power consumption. However, because a new edge of the LO reference signal is injected into the LO signal path within the delay line 510 at every LO cycle, the noise generated between the LO signal phases is reset frequently, and thus does not accumulate. As a result, generation of the LO signal phases using DLL circuits, as described above with respect to the present embodiments, may satisfy noise requirements by dissipating very low power.

FIG. 7 is a timing diagram 700 illustrating an exemplary generation of the local oscillator signal phases by post-processing the DLL output phases in accordance with some embodiments. More specifically, timing diagram 700 depicts how the outputs of DLL circuit 500 of FIG. 5 may be used to generate LO signal phases having any given duty cycle DC=k/N, where N indicates the number of local oscillator signal phases generated by the DLL circuit 500, and k is an integer between one and N−1. Specifically, the $n^{th}$ duty-cycled local oscillator signal phase may be generated by logically combining (e.g., logically ANDing) the local oscillator signal phase ($LO_n$) provided by the $n^{th}$ delay element of the delay line 510 with the complement of the local oscillator signal phase ($\overline{LOn+k}$) provided by the $(n+k)^{th}$ delay element of the delay line 510. For some embodiments, if the value of (n+k) is greater than the value of N, then the value (n+k)-N may be used.

Figure 8A:
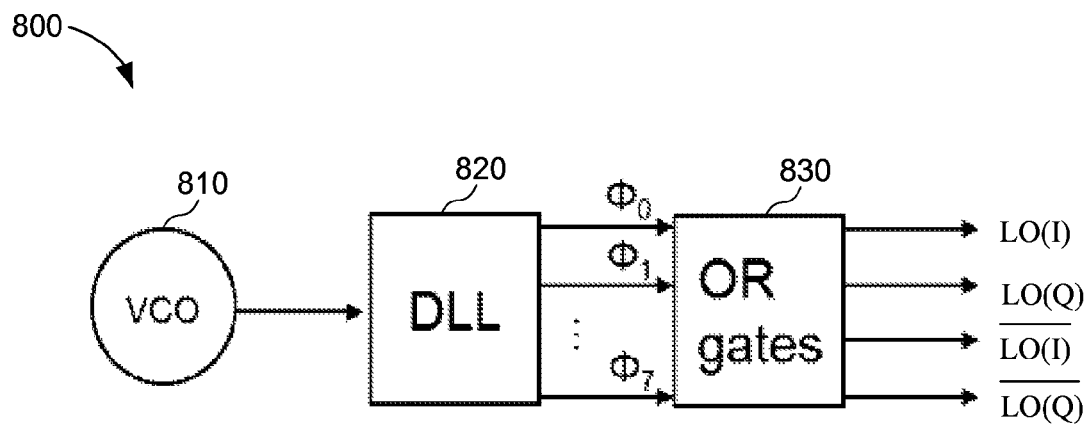
FIG. 8A shows a block diagram of a clock generation circuit in accordance with still other embodiments.

FIG. 8A shows a clock generation circuit 800 that, in accordance with the present embodiments, may generate the local oscillator signal phases LO(I), LO(Q), $\overline{LO(I)}$, and $\overline{LO(Q)}$ in a manner that reduces VCO pulling (e.g., as compared to the clock generation circuit 200 of FIG. 2A). Clock generation circuit 800 includes a VCO 810, a DLL circuit 820, and a combinational logic circuit 830 formed by a plurality of OR gates (not individually shown in FIG. 8A for simplicity). The VCO 810 is coupled to DLL circuit 820, which is coupled to combinational logic circuit 830. The VCO 810, which may be any suitable VCO or other suitable circuit, generates an oscillating signal of frequency $f_{VCO}$ equal to one-half the RF frequency (i.e., $f_{VCO}=f_{RF}/2$). The DLL circuit 820, which may be formed using one or more embodiments of the DLL circuit 500 of FIG. 5, delays the oscillating signal to generate eight different DLL output phases $\phi_0$ to $\phi_7$, each having a duty cycle equal to one-half the desired duty cycle at the radio frequency. Thus, for at least some embodiments, the DLL circuit 820 may include eight delay taps (not shown for simplicity) to provide the eight DLL output phases $\phi_0$ to $\phi_7$.

The combinational logic circuit 830 logically ORs corresponding pairs of the eight DLL output phases $\phi_0$ to $\phi_7$ to generate the local oscillator signal phases LO(I), LO(Q), $\overline{LO(I)}$, and $\overline{LO(Q)}$. For some embodiments, the combinational logic circuit 830 includes a first OR gate that logically ORs the DLL output phases $\phi_0$ and $\phi_4$ to generate the first local oscillator signal phase LO(I), the combinational logic circuit 830 includes a second OR gate that logically ORs the DLL output phases $\phi_1$ and $\phi_5$ to generate the second local oscillator signal phase LO(Q), the combinational logic circuit 830 includes a third OR gate that logically ORs the DLL output phases $\phi_2$ and $\phi_6$ to generate the third local oscillator signal phase $\overline{LO(I)}$, and the combinational logic circuit 830 includes a fourth OR gate that logically ORs the DLL output phases $\phi_3$ and $\phi_7$ to generate the fourth local oscillator signal phase $\overline{LO(Q)}$. For some embodiments, the frequency of the oscillating signal is equal to one-half the frequency of the local oscillator signal phases LO(I), LO(Q), $\overline{LO(I)}$, and $\overline{LO(Q)}$. Thus, for such embodiments, the embodiment of FIG. 8 using combinational logic circuit 830 may effectively double the frequency $f_{VCO}$ of the oscillating signal when generating the local oscillator signal phases LO(I), LO(Q), $\overline{LO(I)}$, and $\overline{LO(Q)}$.

For some embodiments, the frequency $f_{VCO}$ of the oscillating signal is equal to 1/K times the frequency of the local oscillator signal phases, the combinational logic circuit 830 generates a number P of the local oscillator signal phases, and the DLL circuit 820 includes a number N=P*K of outputs to provide a corresponding number N of DLL output phases, wherein K, N, and P are all integers greater than one. For at least one embodiment, K=2, N=8, and P=4.

Figure 8B:
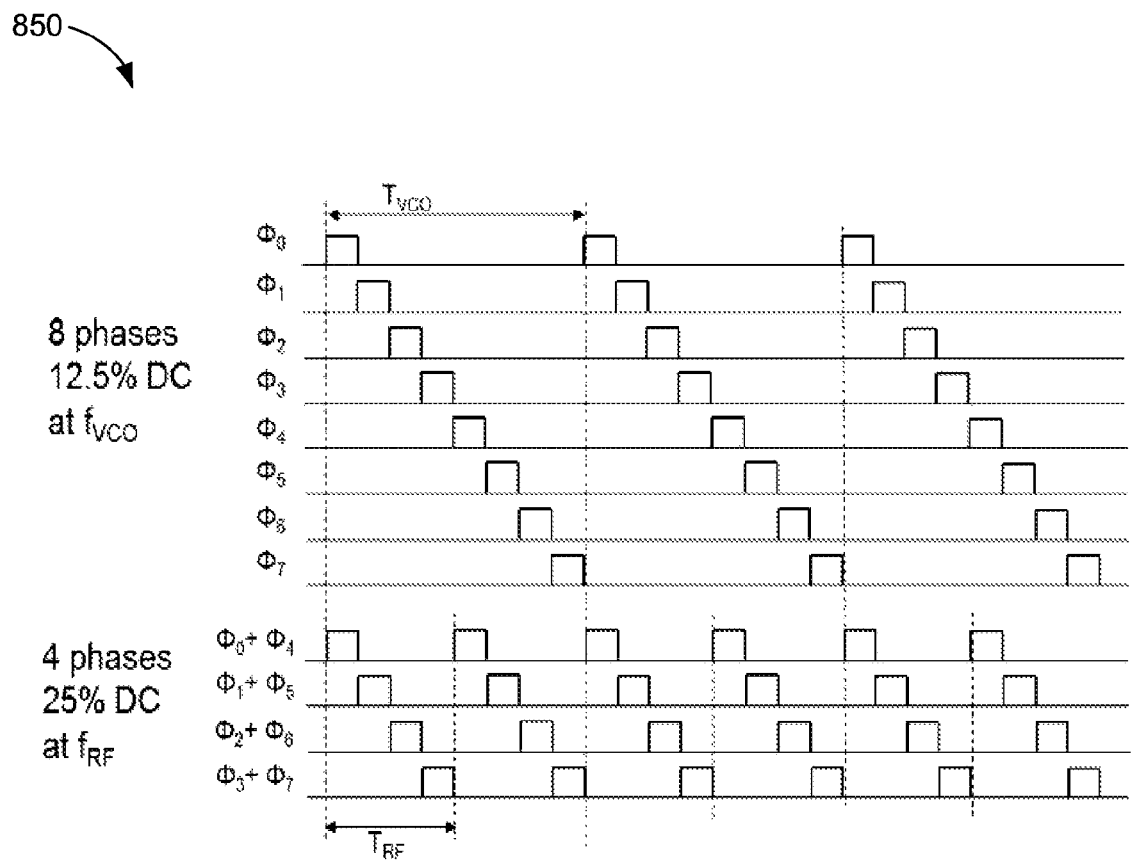
FIG. 8B shows an exemplary timing diagram of the DLL output signal phases and the local oscillator signal phases associated with the clock generation circuit of FIG. 8A.

FIG. 8B depicts the eight DLL output phases $\phi_0$ to $\phi_7$ generated by the DLL circuit 820, where each of the DLL output phases $\phi_0$ to $\phi_7$ has a 12.5% duty cycle. The four local oscillator signal phases LO(I), LO(Q), $\overline{LO(I)}$, and $\overline{LO(Q)}$, which as described above may be generated by combinational logic circuit 830 in response to the eight DLL output phases $\phi_0$ to $\phi_7$, each have a 25% duty cycle. As mentioned above, for the exemplary embodiment of FIG. 8A, the frequency $f_{VCO}$ of the oscillating signal is equal to one-half the RF frequency. Because the frequency $f_{VCO}$ of the oscillating signal is one-half the RF frequency (e.g., rather than an integer multiple of the RF frequency), the clock generation circuit 800 is less susceptible to VCO pulling (e.g., as compared to clock generation circuit 200 of FIG. 2A).

Note that imperfections in the DLL circuit 820 may result in a mismatch between the two RF periods lying inside each VCO period, and may also result in spurs at frequencies equal to $0.5*f_{RF}$, $1.5*f_{RF}$, and so on.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, the method steps depicted in the flow charts of FIG. 6 may be performed in other suitable orders and/or multiple steps may be combined into a single step.

What is claimed is:

1. A clock generation circuit to generate a plurality of local oscillator signal phases, the clock generation circuit comprising:
   a circuit to generate an oscillating signal having a frequency;
   a frequency divider to generate a local oscillator (LO) reference signal having a frequency that is equal to 1/(n+0.5) times the frequency of the oscillating signal, wherein n is an integer value greater than or equal to one, and wherein n+0.5 is a non-integer value; and
   a delay-locked loop (DLL) circuit including an input to receive the LO reference signal and including a plurality of outputs to provide the plurality of local oscillator signal phases, wherein the local oscillator signal phases have the same frequency and are phase-delayed with respect to each other.

2. The clock generation circuit of claim 1, wherein a number of the local oscillator signal phases is one of four, eight, twelve, or sixteen.

3. The clock generation circuit of claim 1, wherein the frequency divider includes a control terminal to receive a control signal indicative of the value of n.

4. The clock generation circuit of claim 1, wherein the DLL circuit comprises:
   a phase-and-frequency detector, including inputs to receive a reference signal and a feedback signal, to generate control signals indicative of a phase difference between the reference signal and the feedback signal;
   a charge pump, coupled to the phase-and-frequency detector, to generate a control voltage in response to the control signals; and
   a delay line, including a first input to receive the LO reference signal and a second input to receive the control voltage, to generate the reference signal, the feedback signal, and a plurality of DLL output phases.

5. The clock generation circuit of claim 4, wherein the DLL output phases comprise the local oscillator signal phases.

6. The clock generation circuit of claim 4, wherein each of the local oscillator signal phases is generated by logically combining a corresponding pair of the DLL output phases, wherein the logical combining is to adjust a duty cycle of the local oscillator signal phase.

7. The clock generation circuit of claim 4, wherein the phase-and-frequency detector is to compare the reference signal and the feedback signal once every M periods of the LO reference signal, wherein M is an integer value greater than or equal to one.

8. The clock generation circuit of claim 1, wherein the local oscillator signal phases have the same frequency as the LO reference signal, and wherein successive local oscillator signal phases are phase-delayed by a phase difference equal to one period of the LO reference signal divided by the number of local oscillator signal phases.

9. A method of providing local oscillator signals to a transmitter or a receiver, the method comprising:
   generating an oscillating signal having a frequency;
   generating a local oscillator (LO) reference signal based on the oscillating signal, wherein the LO reference signal has a frequency that is equal to 1/(n+0.5) times the frequency of the oscillating signal, wherein n is an integer value greater than or equal to one, and wherein n+0.5 is a non-integer value; and
   generating a plurality of local oscillator signal phases based on the LO reference signal, wherein the plurality of local oscillator signal phases all have the same frequency and each have a different phase.

10. The method of claim 9, wherein the LO reference signal is generated by a divide-by-(n+0.5) circuit.

11. The method of claim 10, further comprising:
   generating a control signal indicative of the value of n; and
   providing the control signal to the divide-by-(n+0.5) circuit.

12. The method of claim 9, wherein the plurality of local oscillator signal phases are generated by a delay-locked loop (DLL) circuit including a delay line.

13. The method of claim 9, wherein the oscillating signal is generated by a voltage-controlled oscillator (VCO).

14. The method of claim 9, wherein a number of the local oscillator signal phases is one of four, eight, twelve, or sixteen.

15. The method of claim 12, further comprising:
   adjusting a duty cycle of a selected one of the local oscillator signal phases by logically combining two different outputs of the delay line.

16. A system for providing local oscillator signals to a transmitter or a receiver, the system comprising:
   means for generating an oscillating signal having a frequency;
   means for generating a local oscillator (LO) reference signal based on the oscillating signal, wherein the LO reference signal has a frequency that is equal to 1/(n+0.5) times the frequency of the oscillating signal, wherein n is an integer value greater than or equal to one, and wherein n+0.5 is a non-integer value; and means for generating a plurality of local oscillator signal phases based on the LO reference signal, wherein the plurality of local oscillator signal phases have the same frequency and have different phases.

17. The system of claim 16, wherein the LO reference signal is generated by a divide-by-(n+0.5) circuit.

18. The system of claim 17, further comprising:
means for generating a control signal indicative of the value of n; and
means for providing the control signal to the divide-by-(n+0.5) circuit.

19. The system of claim 16, wherein the plurality of local oscillator signal phases are generated by a delay-locked loop (DLL) circuit including a delay line.

20. The system of claim 16, wherein the oscillating signal is generated by a voltage-controlled oscillator (VCO).

21. The system of claim 16, wherein a number of the local oscillator signal phases is one of four, eight, twelve, or sixteen.

22. The system of claim 19, further comprising:
means for adjusting a duty cycle of a selected one of the local oscillator signal phases by logically combining two different outputs of the delay line.

23. A clock generation circuit to generate a plurality P of local oscillator signal phases each having a same local oscillator frequency, wherein P is an integer greater than one, the clock generation circuit comprising:
a circuit to generate an oscillating signal having a frequency equal to 1/K times the local oscillator frequency, wherein K is an integer;
a delay-locked loop (DLL) circuit including an input to receive the oscillating signal and including a number N=P*K of outputs to provide a corresponding number N of DLL output phases, wherein the DLL output phases have the same frequency and are phase-delayed with respect to each other; and
a combinational logic circuit including a number of inputs to receive the DLL output phases, and including a plurality of outputs to provide the plurality of local oscillator signal phases.

24. The clock generation circuit of claim 23, wherein the DLL output phases have the same frequency as the oscillating signal, and wherein successive DLL output phases are phase-delayed by a phase difference equal to one period of the oscillating signal divided by the number N.

25. The clock generation circuit of claim 23, wherein P=4, N=8, and K=2.

26. The clock generation circuit of claim 23, wherein a duty cycle of the local oscillator signal phases is adjusted by the combinational logic circuit.

27. The clock generation circuit of claim 24, wherein the DLL circuit comprises:
a phase-and-frequency detector, including inputs to receive a reference signal and a feedback signal, to generate control signals indicative of a phase difference between the reference signal and the feedback signal, wherein the phase-and-frequency detector is to compare the reference signal and the feedback signal once every M periods of the LO reference signal, wherein M is an integer greater than or equal to one.

28. The clock generation circuit of claim 27, wherein the DLL circuit includes a delay line comprising:
a first signal path to generate the reference signal in response to the oscillating signal and the control voltage; and
a second signal path, separate from the first signal path, to generate the feedback signal in response to the oscillating signal and the control voltage.

29. The clock generation circuit of claim 27, wherein the second signal path further comprises:
a plurality of series-connected delay elements, each having an output terminal to generate a corresponding one of the plurality of DLL output phases, wherein the control voltage is to adjust a delay provided by each of the delay elements.

* * * * *